United States Patent
Iwasaki et al.

(10) Patent No.: US 10,763,240 B2
(45) Date of Patent: Sep. 1, 2020

(54) SEMICONDUCTOR DEVICE COMPRISING SIGNAL TERMINALS EXTENDING FROM ENCAPSULANT

(71) Applicant: DENSO CORPORATION, Kariya, Aichi-Pref (JP)

(72) Inventors: Shingo Iwasaki, Toyota (JP); Kaisei Satou, Miyoshi (JP); Yuri Imai, Miyoshi (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/269,242

(22) Filed: Feb. 6, 2019

(65) Prior Publication Data
US 2019/0279961 A1    Sep. 12, 2019

(30) Foreign Application Priority Data
Mar. 6, 2018 (JP) ................. 2018-039925

(51) Int. Cl.
  *H01L 23/49*     (2006.01)
  *H01L 25/065*    (2006.01)
  *H01L 23/00*     (2006.01)
  *H01L 23/498*    (2006.01)

(52) U.S. Cl.
  CPC .... *H01L 25/0655* (2013.01); *H01L 23/49811* (2013.01); *H01L 23/49844* (2013.01); *H01L 24/49* (2013.01)

(58) Field of Classification Search
  None
  See application file for complete search history.

(56) References Cited

U.S. PATENT DOCUMENTS

2014/0159216 A1*  6/2014  Ishino .............. H01L 21/50
                                                    257/675
2015/0162274 A1   6/2015  Kadoguchi et al.
2016/0093557 A1*  3/2016  Nishikizawa ..... H01L 23/49503
                                                    257/676

FOREIGN PATENT DOCUMENTS

JP       2015-130465 A       7/2015

* cited by examiner

*Primary Examiner* — Bilkis Jahan
(74) *Attorney, Agent, or Firm* — Oliff PLC

(57) ABSTRACT

A semiconductor device may include a first semiconductor chip, a second semiconductor chip, an encapsulant encapsulating the first and second semiconductor chips, a first signal terminal extending over inside and outside of the encapsulant and connected to the first semiconductor chip inside the encapsulant, and a second signal terminal extending over the inside and the outside of the encapsulant and connected to the second semiconductor chip inside the encapsulant. The first and second signal terminals may protrude from the encapsulant in a same direction. The first signal terminal may include, inside the encapsulant, a section where the first signal terminal extends farther away from the second signal terminal along a direction toward the first semiconductor chip. The second signal terminal may include, inside the encapsulant, a section where the second signal terminal extends farther away from the first signal terminal along a direction toward the second semiconductor chip.

16 Claims, 12 Drawing Sheets

SEMICONDUCTOR DEVICE COMPRISING SIGNAL TERMINALS EXTENDING FROM ENCAPSULANT

CROSS-REFERENCE

This application claims priority to Japanese Patent Application No. 2018-039925, filed on Mar. 6, 2018, the entire contents of which are incorporated herein by reference.

TECHNICAL FIELD

A technology disclosed herein relates to a semiconductor device.

BACKGROUND

Japanese Patent Application Publication No. 2015-130465 describes a semiconductor device. This semiconductor device includes a first semiconductor chip and a second semiconductor chip, an encapsulant encapsulating the first semiconductor chip and the second semiconductor chip, and a first signal terminal and a second signal terminal both extending over inside and outside of the encapsulant. The first signal terminal is connected to the first semiconductor chip via a bonding wire inside the encapsulant. The second signal terminal is connected to the second semiconductor chip via a bonding wire inside the encapsulant. The first signal terminal and the second signal terminal protrude from the encapsulant in a same direction.

SUMMARY

The first signal terminal and the second signal terminal, which protrude from the encapsulant in the same direction, are usually connected to external equipment such as a control substrate. Therefore, to avoid increasing a size of the external equipment, it is desirable to set a distance (spacing) between the first signal terminal and the second signal terminal to be relatively small. On the other hand, a distance between the first semiconductor chip and the second semiconductor chip cannot be set to be small much due to design constraints inside the encapsulant, and the like. Due to this, when a distance between the first signal terminal and the second signal terminal is designed to be small, the first signal terminal and the second signal terminal are apart from the first semiconductor chip and the second semiconductor chip, respectively, inside the encapsulant. Consequently, the bonding wire that connects the first signal terminal and the first semiconductor chip, and the bonding wire that connects the second signal terminal and the second semiconductor chip are made longer. Longer bonding wires cause higher impedance, for example, and thus greater degradation or loss in signal transmission may be caused thereby. Alternatively, longer bonding wires are more likely to be displaced in a process of forming the encapsulant, and thus a risk of, for example, an electrical short circuit becomes higher. The disclosure herein provides a technology capable of shortening or omitting a bonding wire.

The technology disclosed herein is embodied by a semiconductor device. This semiconductor device may comprise a first semiconductor chip and a second semiconductor chip, an encapsulant encapsulating the first semiconductor chip and the second semiconductor chip, a first signal terminal extending over inside and outside of the encapsulant and connected to the first semiconductor chip inside the encapsulant, and a second signal terminal extending over the inside and the outside of the encapsulant and connected to the second semiconductor chip inside the encapsulant. The first signal terminal and the second signal terminal may protrude from the encapsulant in a same direction. The first signal terminal may comprise, inside the encapsulant, a section where the first signal terminal extends farther away from the second signal terminal along a direction toward the first semiconductor chip. The second signal terminal may comprise, inside the encapsulant, a section where the second signal terminal extends farther away from the first signal terminal along a direction toward the second semiconductor chip.

According to the above configuration, a distance (spacing) between the first signal terminal and the second signal terminal can be made small outside the encapsulant, and the first signal terminal and the second signal terminal can be made close to the first semiconductor chip and the second semiconductor chip, respectively, inside the encapsulant. As described before, when the distance between the first signal terminal and the second signal terminal is small outside the encapsulant, increase in a size of external equipment to which they are connected can be avoided. Alternatively, in a case where another terminal exists adjacent to the the first signal terminal or the second signal terminal, an insulating property from the other terminal can be enhanced by making a distance from the other terminal large. Inside the encapsulant, on the other hand, the first signal terminal is made close to the first semiconductor chip, and the second signal terminal is made close to the second semiconductor chip, by which a bonding wire (or another connecting member) that connects the first signal terminal and the first semiconductor chip, and a bonding wire (or another connecting member) that connects the second signal terminal and the second semiconductor chip can be shortened or omitted.

DETAILED DESCRIPTION

Figure 1:
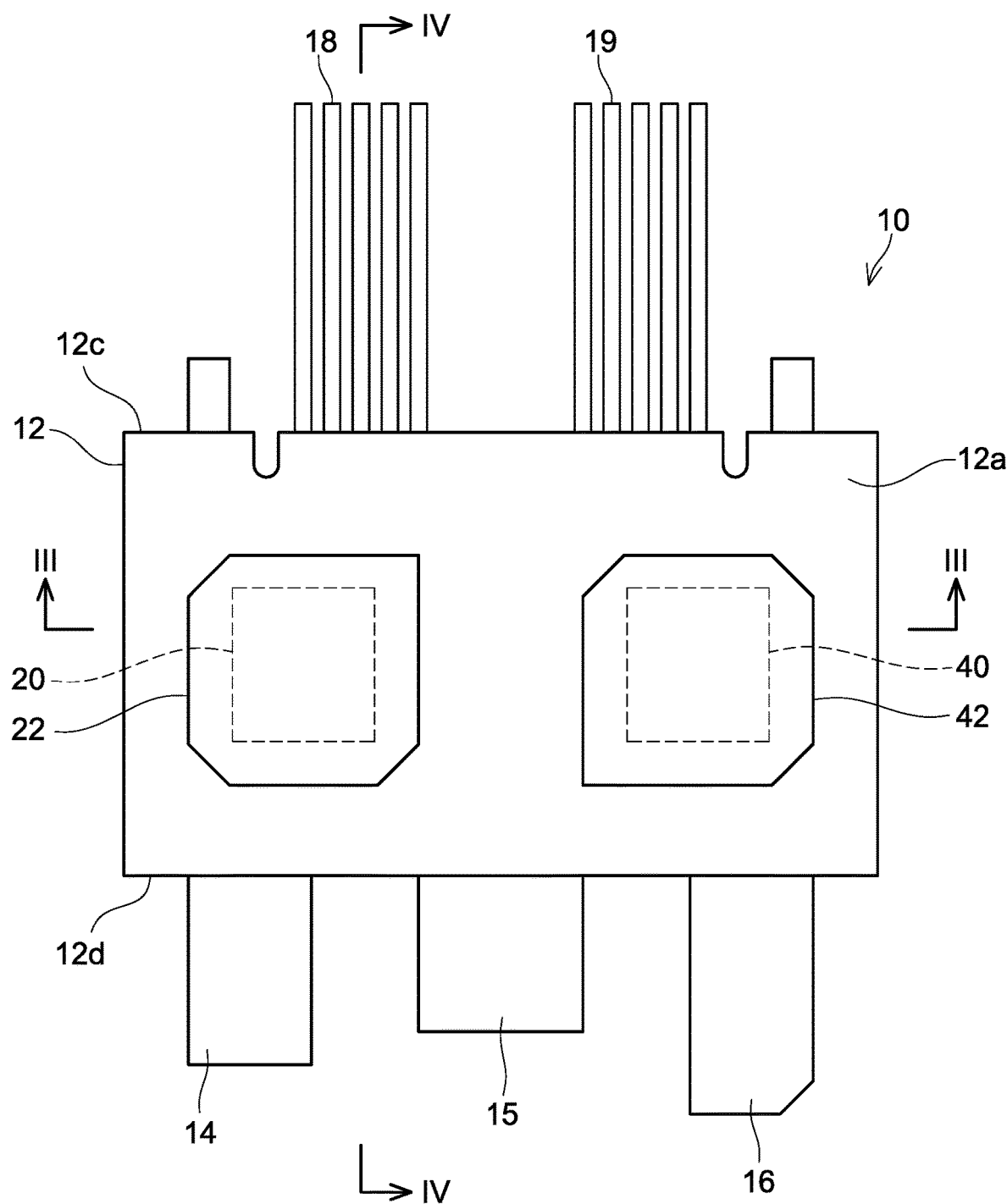
FIG. 1 is a plan view of a semiconductor device 10 in an embodiment.

In an embodiment of the present technology, at least one of the first signal terminal and the second signal terminal may extend linearly outside the encapsulant. According to such a configuration, deformation of the first signal terminal and/or the second signal terminal can be avoided when the first signal terminal and/or the second signal terminal are/is connected to, for example, a connector of a control substrate. In other words, if the first signal terminal and/or the second signal terminal are/is bent outside the encapsulant, the first signal terminal and/or the second signal terminal are/is likely to deform when connected to, for example, a connector of a control substrate.

In an embodiment of the present technology, at least one of the first signal terminal and the second signal terminal may comprise, inside the encapsulant, a crank shape that includes at least two bends. According to such a configuration, the first signal terminal and/or the second signal terminal can be fixed firmly to the encapsulant.

In an embodiment of the present technology, the first signal terminal and the second signal terminal may comprise plane-symmetrical shapes to each other. According to such a configuration, designing and manufacturing of the semiconductor device can be facilitated. Moreover, local generation of high stress (i.e., stress concentration) in the semiconductor device can be suppressed by having the structural symmetry.

In an embodiment of the present technology, at least one of the first signal terminal and the second signal terminal may comprise a plate shape and is bent in a direction of thickness of the at least one of the first and second signal terminals inside the encapsulant. According to such a configuration, the first signal terminal and/or the second signal terminal can be fixed more firmly to the encapsulant.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Embodiments

With reference to the drawings, a semiconductor device 10 in an embodiment will be described. The semiconductor device 10 in the present embodiment can be used for a power conversion circuit such as a converter or an inverter, in an electrically-operated vehicle such as an electric vehicle, a hybrid vehicle, and a fuel-cell vehicle. It should be noted that no particular limitation is imposed on application purposes of the semiconductor device 10. The semiconductor device 10 can be adopted widely for various devices and circuits.

As shown in FIGS. 1 to 4, the semiconductor device 10 includes a first semiconductor chip 20, a second semiconductor chip 40, an encapsulant 12, and a plurality of terminals 14, 15, 16, 18, 19. The first semiconductor chip 20 and the second semiconductor chip 40 are power semiconductor chips, and are encapsulated inside the encapsulant 12. The encapsulant 12 is constituted of a thermosetting resin such as epoxy resin, but is not particularly limited thereto. The encapsulant 12 in the present embodiment has a generally plate shape, and includes an upper surface 12a, a lower surface 12b positioned opposite to the upper surface 12a, a first end surface 12c adjacent to the upper surface 12a and the lower surface 12b, and a second end surface 12d adjacent to the upper surface 12a and the lower surface 12b and positioned opposite to the first end surface 12c. It should be noted that the shape of the encapsulant 12 is not limited to the one exemplified in the present embodiment, and can be modified as appropriate.

Each of the terminals 14, 15, 16, 18, 19 extends over outside and inside of the encapsulant 12, and is electrically connected to at least one of the first semiconductor chip 20 and the second semiconductor chip 40 inside the encapsulant 12. As an example, the plurality of terminals 14, 15, 16, 18, 19 includes a P terminal 14, an N terminal 15, and an O terminal 16 for power, and a plurality of first signal terminals 18 and a plurality of second signal terminals 19 for signals. The P terminal 14, the N terminal 15, and the O terminal 16 protrude from the second end surface 12d of the encapsulant 12, and extend parallel to one another along a same direction. The plurality of first signal terminals 18 and the plurality of second signal terminals 19 protrude from the first end surface 12c of the encapsulant 12, and extend parallel to one another along a same direction. The plurality of first signal terminals 18 and the plurality of second signal terminals 19 are respectively connected to, for example, connectors 4 of an external control substrate 2 (see FIG. 5).

The first semiconductor chip 20 includes an upper surface electrode 20a, a lower surface electrode 20b, and a plurality of signal electrodes 20c. The upper surface electrode 20a and the plurality of signal electrodes 20c are positioned at an upper surface of the first semiconductor chip 20, and the lower surface electrode 20b is positioned at a lower surface of the first semiconductor chip 20. The first semiconductor chip 20 is a vertical-type semiconductor chip including a pair of the upper and lower electrodes 20a, 20b. The signal electrodes 20c are electrodes for inputting and outputting various signals such as a drive signal for the first semiconductor chip 20, a temperature signal that indicates a temperature of the first semiconductor chip 20, and a current signal that indicates a current in the first semiconductor chip 20. Similarly, the second semiconductor chip 40 includes an upper surface electrode 40a, a lower surface electrode 40b, and a plurality of signal electrodes 40c. The upper surface electrode 40a and the plurality of signal electrodes 40c are positioned at an upper surface of the second semiconductor chip 40, and the lower surface electrode 40b is positioned at a lower surface of the second semiconductor chip 40. In other words, the second semiconductor chip 40 is also a vertical-type semiconductor chip including a pair of the upper and lower electrodes 40a, 40b. The first semiconductor chip 20 and the second semiconductor chip 40 in the present embodiment are semiconductor chips of a same type, and specifically are reverse conducting insulated gate bipolar transistor (RC-IGBT) chips each provided with an insulated gate bipolar transistor (IGBT) and a diode therein.

It should be noted that each of the first semiconductor chip 20 and the second semiconductor chip 40 is not limited to an RC-IGBT chip, and may be another power semiconductor chip such as a metal-oxide-semiconductor field-effect transistor (MOSFET) chip. Alternatively, each of the first semiconductor chip 20 and the second semiconductor chip 40 may be replaced by two or more semiconductor chips such as a diode chip and an IGBT chip (or a MOSFET chip). No particular limitation is imposed on a specific configuration of each of the first semiconductor chip 20 and the second semiconductor chip 40, and various semiconductor chips can be adopted. In this case, the first semiconductor chip 20 and the second semiconductor chip 40 may be semiconductor chips of different types from each other. Moreover, each of the first semiconductor chip 20 and the second semiconductor chip 40 can be constituted of various semiconductor materials, for example, silicon (S1), silicon carbide (SiC), or gallium nitride (GaN). No particular limitation is imposed on materials that constitute the upper surface electrode 20a and the lower surface electrode 20b of the first semiconductor chip 20, however, aluminum-based metal or another metal, for example, can be adopted. Similarly, no particular limitation is imposed on materials that constitute the upper surface electrode 40a and the lower surface electrode 40b of the second semiconductor chip 40, however, aluminum-based metal or another metal, for example, can be adopted.

The semiconductor device 10 further includes a first upper heat dissipating plate 22, a first conductor spacer 24, and a first lower heat dissipating plate 26. The first conductor spacer 24 is constituted of an electrically-conductive material, for example, copper or another metal. The first conductor spacer 24 is a member that has a generally plate shape or block shape, and includes an upper surface 24a and a lower surface 24b positioned opposite to the upper surface 24a. The first conductor spacer 24 is positioned in the encapsulant 12. The upper surface 24a of the first conductor spacer 24 is joined to the first upper heat dissipating plate 22 via a solder layer 23. The lower surface 24b of the first conductor spacer 24 is joined to the upper surface electrode 20a of the first semiconductor chip 20 via a solder layer 25. In other words, the first conductor spacer 24 is electrically connected to the first semiconductor chip 20. The first conductor spacer 24 is not necessarily needed, but ensures a space for connecting the first signal terminals 18 to the first semiconductor chip 20.

Each of the first upper heat dissipating plate 22 and the first lower heat dissipating plate 26 is constituted of a material superior in heat conductivity, for example, copper, aluminum, or another metal. The first upper heat dissipating plate 22 is a member that has a generally rectangular parallelepiped shape or plate shape, and includes an upper surface 22a and a lower surface 22b positioned opposite to the upper surface 22a. The upper surface 22a of the first upper heat dissipating plate 22 is exposed to the outside at the upper surface 12a of the encapsulant 12. Moreover, the lower surface 22b of the first upper heat dissipating plate 22 is joined to the aforementioned upper surface 24a of the first conductor spacer 24 via the solder layer 23. In other words, the first upper heat dissipating plate 22 is electrically and thermally connected to the first semiconductor chip 20 via the first conductor spacer 24. Thus, the first upper heat dissipating plate 22 configures a part of an electric circuit of the semiconductor device 10 as well as functions as a heat dissipating plate that dissipates heat of the first semiconductor chip 20 to the outside.

The first lower heat dissipating plate 26 is a member that has a generally rectangular parallelepiped shape or plate shape, and includes an upper surface 26a and a lower surface 26b positioned opposite to the upper surface 26a. The lower surface 26b of the first lower heat dissipating plate 26 is exposed to the outside at the lower surface 12b of the encapsulant 12. Moreover, the upper surface 26a of the first lower heat dissipating plate 26 is joined to the lower surface electrode 20b of the first semiconductor chip 20 via a solder layer 27. In other words, the first lower heat dissipating plate 26 is electrically and thermally connected to the first semiconductor chip 20. Thus, the first lower heat dissipating plate 26 also configures a part of the electric circuit of the semiconductor device 10 as well as functions as a heat dissipating plate that dissipates heat of the first semiconductor chip 20 to the outside. As such, the semiconductor device 10 in the present embodiment includes a double-side cooling structure in which the first upper heat dissipating plate 22 and the first lower heat dissipating plate 26 are exposed at the surfaces 12a, 12b of the encapsulant 12, respectively.

The semiconductor device 10 further includes a second upper heat dissipating plate 42, a second conductor spacer 44, and a second lower heat dissipating plate 46. The second conductor spacer 44 is constituted of an electrically-conductive material, for example, copper or another metal. The second conductor spacer 44 is a member that has a generally plate shape or block shape, and includes an upper surface 44a and a lower surface 44b positioned opposite to the upper surface 44a. The second conductor spacer 44 is positioned in the encapsulant 12. The upper surface 44a of the second conductor spacer 44 is joined to the second upper heat dissipating plate 42 via a solder layer 43. The lower surface 44b of the second conductor spacer 44 is joined to the upper surface electrode 40a of the second semiconductor chip 40 via a solder layer 45. In other words, the second conductor spacer 44 is electrically connected to the second semiconductor chip 40. The second conductor spacer 44 is not necessarily needed, but ensures a space for connecting the second signal terminals 19 to the second semiconductor chip 40.

Each of the second upper heat dissipating plate 42 and the second lower heat dissipating plate 46 is constituted of a material superior in heat conductivity, for example, copper, aluminum, or another metal. The second upper heat dissipating plate 42 is a member that has a generally rectangular parallelepiped shape or plate shape, and includes an upper surface 42a and a lower surface 42b positioned opposite to the upper surface 42a. The upper surface 42a of the second upper heat dissipating plate 42 is exposed to the outside at the upper surface 12a of the encapsulant 12. Moreover, the lower surface 42b of the second upper heat dissipating plate 42 is joined to the upper surface 44a of the aforementioned second conductor spacer 44 via the solder layer 43. In other words, the second upper heat dissipating plate 42 is electrically and thermally connected to the second semiconductor chip 40 via the second conductor spacer 44. Thus, the second upper heat dissipating plate 42 configures a part of the electric circuit of the semiconductor device 10 as well as functions as a heat dissipating plate that dissipates heat of the second semiconductor chip 40 to the outside.

The second lower heat dissipating plate 46 is a member that has a generally rectangular parallelepiped shape or plate shape, and includes an upper surface 46a and a lower surface 46b positioned opposite to the upper surface 46a. The lower surface 46b of the second lower heat dissipating plate 46 is exposed to the outside at the lower surface 12b of the encapsulant 12. Moreover, the upper surface 46a of the second lower heat dissipating plate 46 is joined to the lower surface electrode 40b of the second semiconductor chip 40 via a solder layer 47. In other words, the second lower heat dissipating plate 46 is electrically and thermally connected to the second semiconductor chip 40. Thus, the second lower heat dissipating plate 46 also configures a part of the electric circuit of the semiconductor device 10 as well as functions as a heat dissipating plate that dissipates heat of the second semiconductor chip 40 to the outside. As such, the semiconductor device 10 in the present embodiment includes a double-side cooling structure in which the second upper heat dissipating plate 42 and the second lower heat dissipating plate 46 are exposed at the surfaces 12a, 12b of the encapsulant 12, respectively. The second lower heat dissipating plate 46 is connected to the first upper heat dissipating plate 22 via a first joint 22c and a second joint 46c, which will be described later.

As described above, the semiconductor device 10 includes the P terminal 14, the N terminal 15, and the O terminal 16, as external connection terminals. The P terminal 14, the N terminal 15, and the O terminal 16 in the present embodiment are constituted of copper. It should be noted that the material that constitutes the P terminal 14, the N terminal 15, and the O terminal 16 is not limited to copper, and may be another conductor. The P terminal 14 is connected to the upper surface 26a of the first lower heat dissipating plate 26 inside the encapsulant 12. The N terminal 15 is connected to the lower surface 42b of the second upper heat dissipating plate 42 inside the encapsulant 12. The O terminal 16 is connected to the upper surface 46a of the second lower heat dissipating plate 46. As an example, the P terminal 14 and the O terminal 16 are configured integrally with the first lower heat dissipating plate 26 and the second lower heat dissipating plate 46, respectively. It should be noted that one or both of the P terminal 14 and the O terminal 16 may be joined to the first lower heat dissipating plate 26 or/and the second lower heat dissipating plate 46, respectively, by, for example, welding. Moreover, the N terminal 15 is joined to a third joint 42c of the second upper heat dissipating plate 42 by soldering, which will be described later.

The first signal terminals 18 are connected to the signal electrodes 20c of the first semiconductor chip 20 inside the encapsulant 12, respectively. In the present embodiment, each of the first signal terminals 18 and corresponding one of the signal electrodes 20c of the first semiconductor chip 20 are connected via a bonding wire 18a. It should be noted that the first signal terminals 18 and the signal electrodes 20c may be connected directly without the bonding wires 18a or other connecting members interposed therebetween. Similarly, the second signal terminals 19 are connected to the signal electrodes 40c of the second semiconductor chip 40 inside the encapsulant 12, respectively. Each of the second signal terminals 19 and corresponding one of the signal electrodes 40c of the second semiconductor chip 40 are also connected via a bonding wire 19a. It should be noted that the second signal terminals 19 and the signal electrodes 40c may be connected directly without the bonding wires 19a or other connecting members interposed therebetween.

Figure 2:
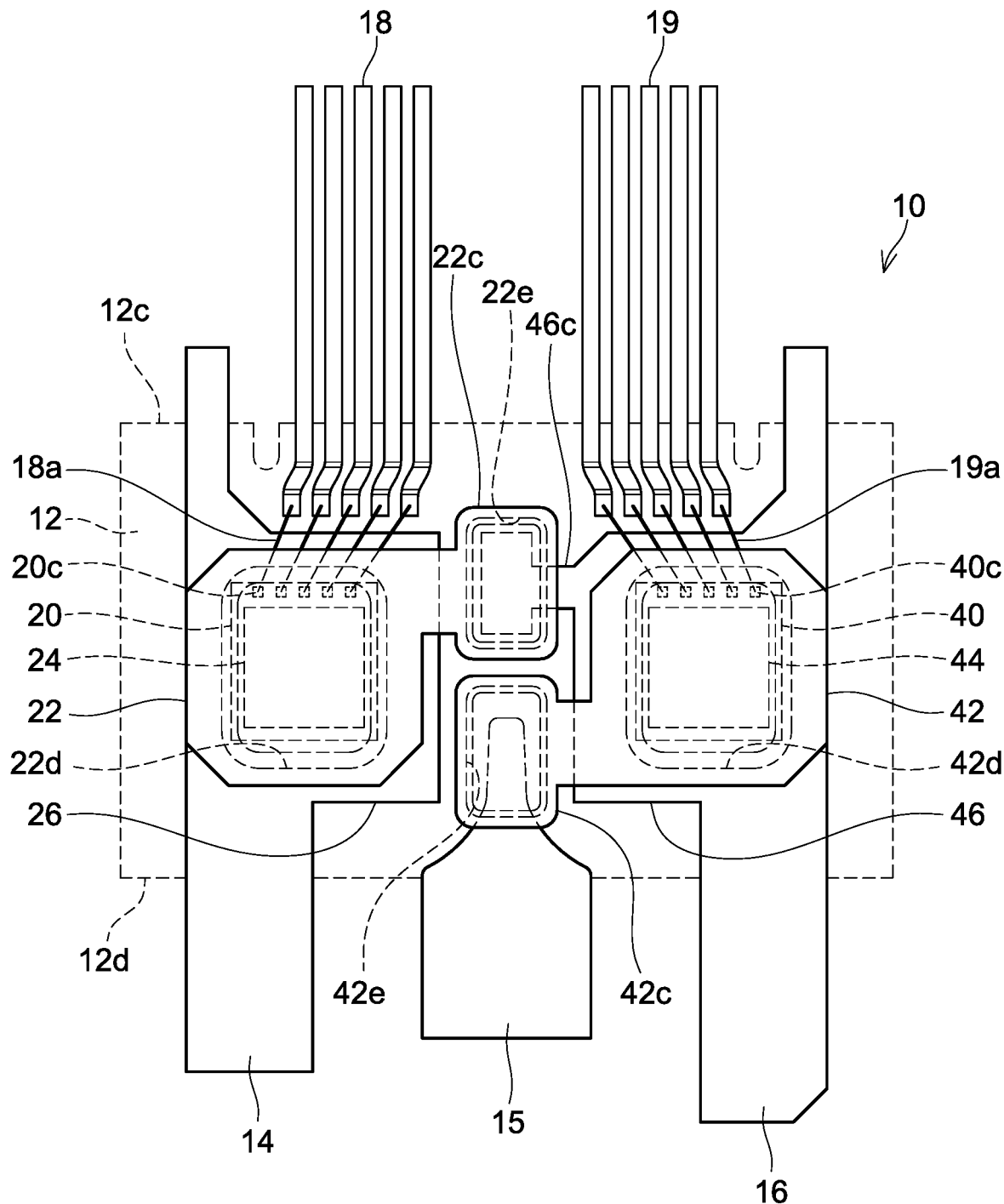
FIG. 2 is a plan view showing an internal structure of the semiconductor device 10.
Figure 3:
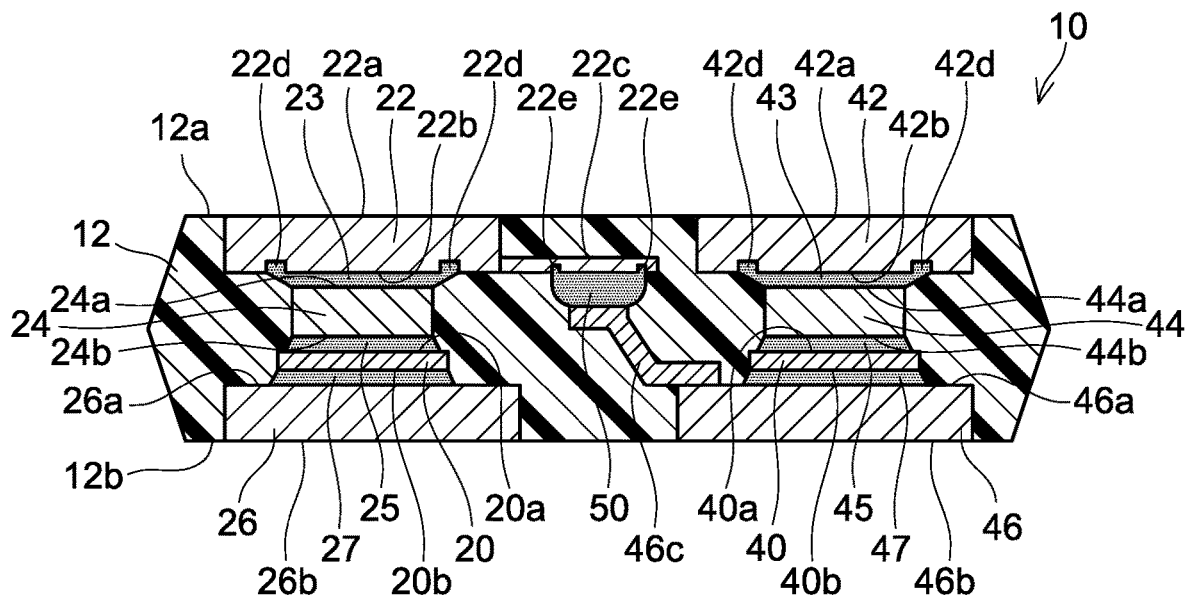
FIG. 3 is a cross-sectional view taken along a line III-III in FIG. 1, which shows the internal structure of the semiconductor device 10.
Figure 4:
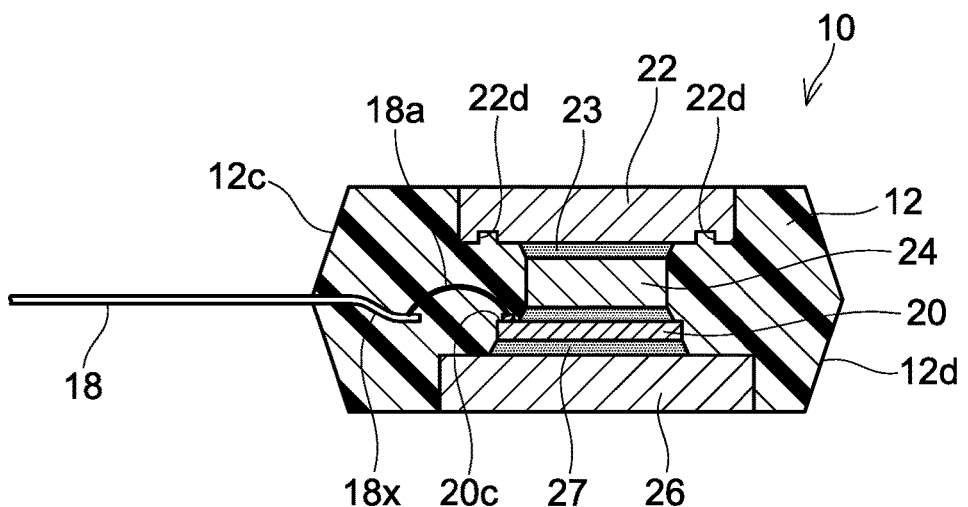
FIG. 4 is a cross-sectional view taken along a line IV-IV in FIG. 1, which shows the internal structure of the semiconductor device 10.

As shown in FIGS. 2 and 3, the first upper heat dissipating plate 22 of the semiconductor device 10 further includes the first joint 22c constituted of a conductor. Similarly, the second lower heat dissipating plate 46 also further includes the second joint 46c constituted of a conductor. The first joint 22c and the second joint 46c are positioned inside the encapsulant 12. The first joint 22c of the first upper heat dissipating plate 22 is joined to the second joint 46c of the second lower heat dissipating plate 46 via a solder layer 50. In other words, the first joint 22c and the second joint 46c electrically connect the first upper heat dissipating plate 22 and the second lower heat dissipating plate 46 to each other. The first semiconductor chip 20 and the second semiconductor chip 40 are thereby connected in series via the first joint 22c and the second joint 46c. The first joint 22c and the second joint 46c can be constituted of, for example, copper. The first joint 22c and the first upper heat dissipating plate 22 may be configured integrally or may be joined to each other. In a case of joining them, no particular limitation is imposed on the joining technique, and they may be joined by welding, for example. Similarly, the second joint 46c and the second lower heat dissipating plate 46 may be configured integrally or may be joined to each other. In a case of joining them, no particular limitation is imposed on the joining technique, either, and they may be joined by welding, for example.

The second upper heat dissipating plate 42 of the semiconductor device 10 includes the third joint 42c constituted of a conductor. The third joint 42c is positioned inside the encapsulant 12, and is joined to the N terminal 15 via a solder layer 60 (see FIG. 17). The second semiconductor chip 40 is thereby electrically connected to the N terminal 15 via the second upper heat dissipating plate 42 and the third joint 42c. The third joint 42c can be constituted of, for example, copper. The third joint 42c and the second upper heat dissipating plate 42 may be configured integrally or may be joined to each other. In a case of joining them, no particular limitation is imposed on the joining technique, and they may be joined by welding, for example.

As shown in FIGS. 2 and 3, the lower surface 22b of the first upper heat dissipating plate 22 is provided with a solder absorbing groove 22d such that the solder absorbing groove 22d surrounds the solder layer 23. This solder absorbing groove 22d takes in excessive solder when the first conductor spacer 24 and the first upper heat dissipating plate 22 are soldered, by which wetting and spreading of the solder to an unintended range can be prevented. Similarly, the lower surface 42b of the second upper heat dissipating plate 42 is provided with a solder absorbing groove 42d such that the solder absorbing groove 42d surrounds the solder layer 43. This solder absorbing groove 42d takes in excessive solder when the second conductor spacer 44 and the second upper heat dissipating plate 42 are soldered, by which wetting and spreading of the solder to an unintended range can be prevented. As an example, the semiconductor device 10 in the present embodiment adopts members having a same shape for the first upper heat dissipating plate 22 and the second upper heat dissipating plate 42, respectively.

The first joint 22c of the first upper heat dissipating plate 22 is also provided with a solder absorbing groove 22e. The solder absorbing groove 22e is provided to surround the solder layer 50 positioned between the first joint 22c and the second joint 46c. This solder absorbing groove 22e takes in excessive solder when the first joint 22c and the second joint 46c are soldered, by which wetting and spreading of the solder to an unintended range can be prevented. Similarly, the third joint 42c of the second upper heat dissipating plate 42 is also provided with a solder absorbing groove 42e. The solder absorbing groove 42e is provided to surround the solder layer 60 (see FIG. 17) positioned between the third joint 42c and the N terminal 15. This solder absorbing groove 42e takes in excessive solder when the third joint 42c of the second upper heat dissipating plate 42 and the N terminal 15 are soldered, by which wetting and spreading of the solder to an unintended range can be prevented.

Figure 5:
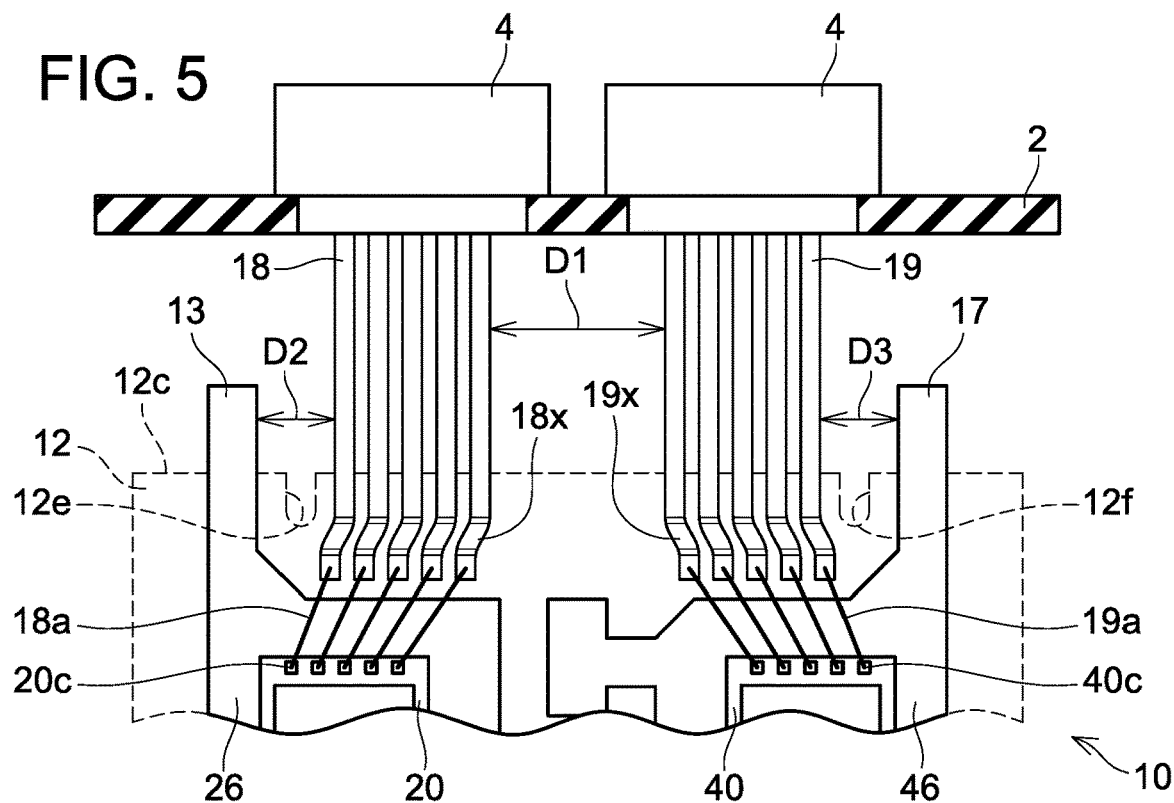
FIG. 5 shows structures of first signal terminals 18 and second signal terminals 19 inside an encapsulant 12.

Next, details of the first signal terminals 18 and the second signal terminals 19 will be described. As shown in FIG. 5, each of the first signal terminals 18 includes a displaced section 18x which is bent inside the encapsulant 12 and displaced toward the first semiconductor chip 20. In the displaced sections 18x, the first signal terminals 18 extend farther away from the second signal terminals 19 along a direction toward the first semiconductor chip 20. Similarly, each of the second signal terminals 19 includes a displaced section 19x which is bent inside the encapsulant 12 and displaced toward the second semiconductor chip 40. In the displaced sections 19x, the second signal terminals 19 extend farther away from the first signal terminals 18 along a direction toward the second semiconductor chip 40.

According to the above configuration, a distance D1 between the plurality of first signal terminals 18 and the plurality of second signal terminals 19 can be made small outside the encapsulant 12, and additionally, the first signal terminals 18 and the second signal terminals 19 can be made close to the first semiconductor chip 20 and the second semiconductor chip 40, respectively, inside the encapsulant 12. As described before, the plurality of first signal terminals 18 and the plurality of second signal terminals 19 are connected to the connectors 4 of the external control substrate 2. Therefore, when the distance D1 between the plurality of first signal terminals 18 and the plurality of second signal terminals 19 is small outside the encapsulant 12, increase in the size of the control substrate 2 to which the plurality of first signal terminals 18 and the plurality of second signal terminals 19 are connected can be avoided.

Meanwhile, since the first signal terminals 18 are made close to the first semiconductor chip 20 inside the encapsulant 12, the bonding wires 18a (or other connecting members) that connect the first signal terminals 18 and the first semiconductor chip 20 can be shortened. Alternatively, the first signal terminals 18 and the first semiconductor chip 20 can also be connected directly without the bonding wires 18a interposed therebetween. Similarly, the bonding wires 19a (or other connecting members) that connect the second signal terminals 19 and the second semiconductor chip 40 can also be shortened or omitted.

Additionally, the semiconductor device 10 in the present embodiment includes a suspended terminal 13 adjacent to the plurality of first signal terminals 18, and another suspended terminal 17 adjacent to the plurality of second signal terminals 19. One of the terminals, namely, the suspended terminal 13 is connected to the first lower heat dissipating plate 26, and thus needs to be electrically insulated from the first signal terminals 18. Similarly, the other of the terminals, namely, the suspended terminal 17 is connected to the second lower heat dissipating plate 46, and thus needs to be electrically insulated from the second signal terminals 19. In this respect, when the distance D1 between the plurality of first signal terminals 18 and the plurality of second signal terminals 19 is small, a distance D2 between the plurality of first signal terminals 18 and the suspended terminal 13 and a distance D3 between the plurality of second signal terminals 19 and the suspended terminal 17 can be made large. Due to this, an insulating property between the plurality of first signal terminals 18 and the suspended terminal 13, and an insulating property between the plurality of second signal terminals 19 and the suspended terminal 17 can be enhanced. A recess 12e is provided in the encapsulant 12 between the plurality of first signal terminals 18 and the suspended terminal 13 to increase a creepage distance therebetween. Similarly, a recess 12f is provided in the encapsulant 12 between the plurality of second signal terminals 19 and the suspended terminal 17 to increase a creepage distance therebetween.

In the semiconductor device 10 in the present embodiment, each of the first signal terminals 18 and the second signal terminals 19 extends linearly outside the encapsulant 12. According to such a configuration, deformation of the first signal terminals 18 and the second signal terminals 19 can be avoided when the first signal terminals 18 and the second signal terminals 19 are connected to, for example, the connectors 4 of the control substrate 2. It should be noted that one or more of the first signal terminals 18 and/or one or more of the second signal terminals 19 may be bent outside the encapsulant 12 in another embodiment.

Figure 6:
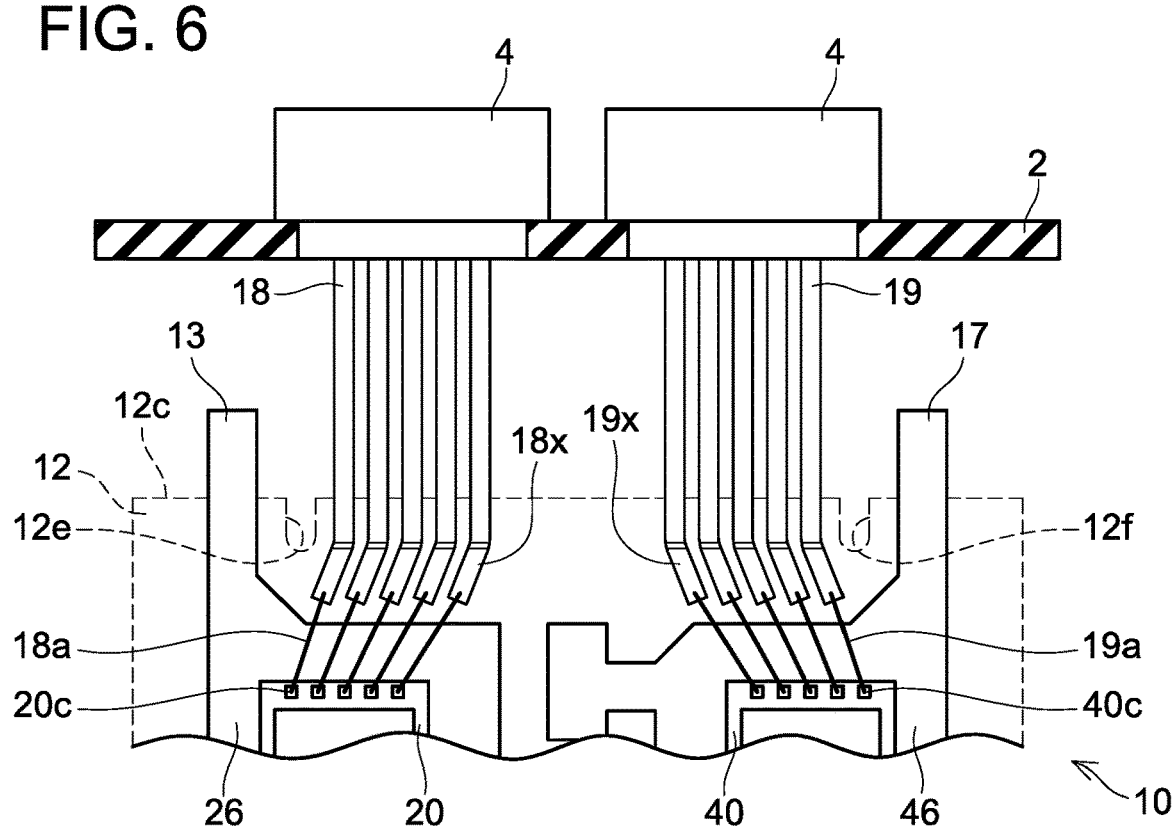
FIG. 6 shows a variant of the first signal terminals 18 and the second signal terminals 19.

In the semiconductor device 10 in the present embodiment, each of the first signal terminals 18 and the second signal terminals 19 includes, inside the encapsulant 12, a crank shape including two bends with corresponding one of the displaced sections 18x, 19x interposed therebetween. According to such a configuration, the first signal terminals 18 and the second signal terminals 19 can be fixed firmly to the encapsulant 12. It should be noted that, as shown in FIG. 6, each of the first signal terminals 18 and the second signal terminals 19 only needs to include at least corresponding one of the displaced sections 18x, 19x, and may not necessarily include a crank shape, in another embodiment. In the example shown in FIG. 6, each of the first signal terminals 18 and the second signal terminals 19 includes corresponding one of the displaced sections 18x. 19x that extend to tips of the signal terminals 18, 19.

Figure 7:
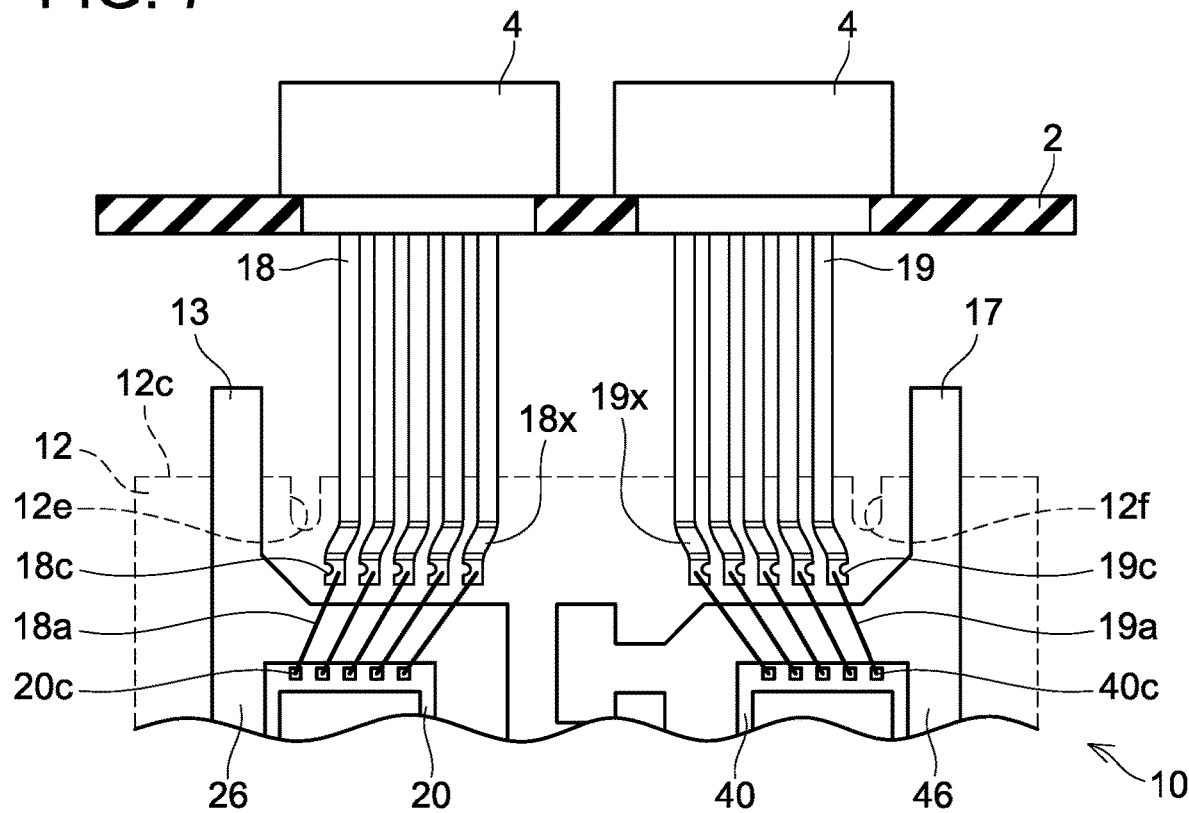
FIG. 7 shows another variant of the first signal terminals 18 and the second signal terminals 19.

As shown in FIG. 7, at least one of the first signal terminals 18 and/or at least one of the second signal terminals 19 may be provided with, inside the encapsulant 12, a notch 18c and/or a notch 19c. According to such a configuration, a part of the encapsulant 12 enters the notch 18c and/or the notch 19c, by which the first signal terminals 18 and/or the second signal terminals 19 are fixed more firmly to the encapsulant 12. It should be noted that, in the semiconductor device 10 in the present embodiment, since the first signal terminals 18 and the second signal terminals 19 include the displaced sections 18x, 19x, respectively, they are fixed firmly to the encapsulant 12. Therefore, the first signal terminals 18 and the second signal terminals 19 are not necessarily provided with the notches 18c, 19c. Omission of the notches 18c, 19c can, for example, reduce impedance of the first signal terminals 18 and the second signal terminals 19.

In the semiconductor device 10 in the present embodiment, the first signal terminals 18 and the second signal terminals 19 comprise plane-symmetrical shapes to each other. According to such a configuration, designing and manufacturing of the semiconductor device 10 can be facilitated. Moreover, local generation of high stress (i.e., stress concentration) in the semiconductor device 10 can be suppressed by having the structural symmetry.

Figure 8:
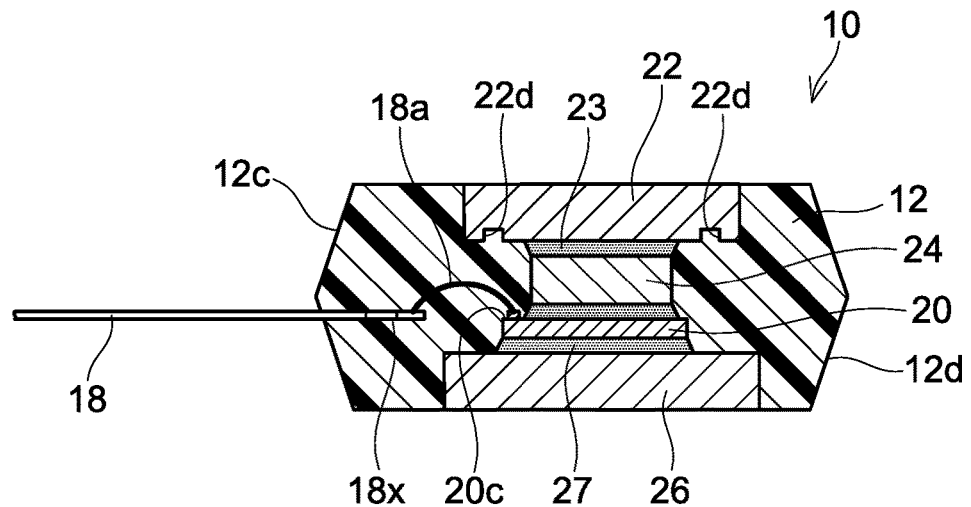
FIG. 8 shows still another variant of the first signal terminals 18 and the second signal terminals 19.

In the semiconductor device 10 in the present embodiment, each of the first signal terminals 18 and the second signal terminals 19 comprises a plate shape and is bent in a direction of thickness of corresponding one of the first and second signal terminals 18, 19 inside the encapsulant 12. According to such a configuration, the first signal terminals 18 and the second signal terminals 19 can be fixed more firmly to the encapsulant 12. It should be noted that, as shown in FIG. 8, one or more of the first signal terminals 18 and/or one or more of the second signal terminals 19 may not be bent in the direction of thickness of the first signal terminals 18 and/or the second signal terminals 19 inside the encapsulant 12 in another embodiment. In other words, one or more of the first signal terminals 18 and/or one or more of the second signal terminals 19 may be flat inside the encapsulant 12.

(Variants Related to Solder Absorbing Grooves 22d, 42d)

As described before, the lower surface 22b of the first upper heat dissipating plate 22 is provided with the solder absorbing groove 22d such that the solder absorbing groove 22d surrounds the solder layer 23. This solder absorbing groove 22d takes in excessive solder when the first conductor spacer 24 and the first upper heat dissipating plate 22 are soldered, by which wetting and spreading of the solder to an unintended range can be prevented. However, the amount of excessive solder varies among semiconductor devices, and hence when the amount of excessive solder is relatively small, for example, the excessive solder is taken in only in a section of the solder absorbing groove 22d. In this case, a part of a periphery of the solder layer 23 is positioned inside the solder absorbing groove 22d, whereas another part of the periphery of the solder layer 23 is positioned outside the solder absorbing groove 22d, which results in significantly different contact angles of the solder (fillet shapes of the solder) between these parts.

Here, when solder melts between two members, adsorption force caused by surface tension of the molten solder acts between the two members. A magnitude of this adsorption force varies in accordance with a contact angle of the solder. Therefore, in a state where excessive solder is taken in only in a section of the solder absorbing groove 22d, adsorption force that acts between the first conductor spacer 24 and the first upper heat dissipating plate 22 is caused unevenly. Consequently, relative positions and orientations between the first conductor spacer 24 and the first upper heat dissipating plate 22 may change, and dimensional accuracy of the semiconductor device 10 may decrease. In particular, if the solder contact angles (i.e., generated adsorption force) are different from each other in opposing two sides of the periphery of the solder layer 23, relative positions and orientations of the two members are likely to change, and dimensional accuracy of the semiconductor device 10 is likely to decrease.

Figure 9:
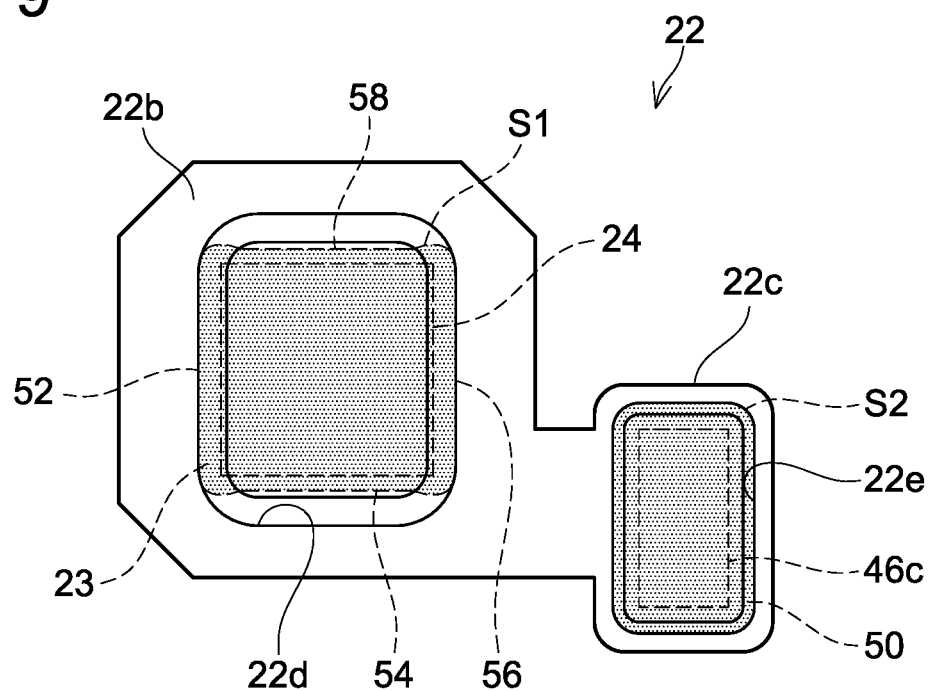
FIG. 9 shows a variant related to a solder absorbing groove 22d in a first upper heat dissipating plate 22.

With respect to the above problem, the solder absorbing groove 22d can adopt a configuration described below. As shown in FIG. 9, a region of the lower surface 22b of the first upper heat dissipating plate 22, which is in contact with the solder layer 23 inserted between the lower surface 22b and the first conductor spacer 24, is herein referred to as a first solder joint area S1. In this case, in a periphery of the first solder joint area S1, two sides 52, 56 opposite to each other in a first direction (in a right-left direction in FIG. 9) may be positioned inside the solder absorbing groove 22d, and additionally, other two sides 54, 58 opposite to each other in a second direction (in an up-down direction in FIG. 9) may be positioned outside the solder absorbing groove 22d. As an example, the first direction and the second direction may be orthogonal to each other.

Figure 10:
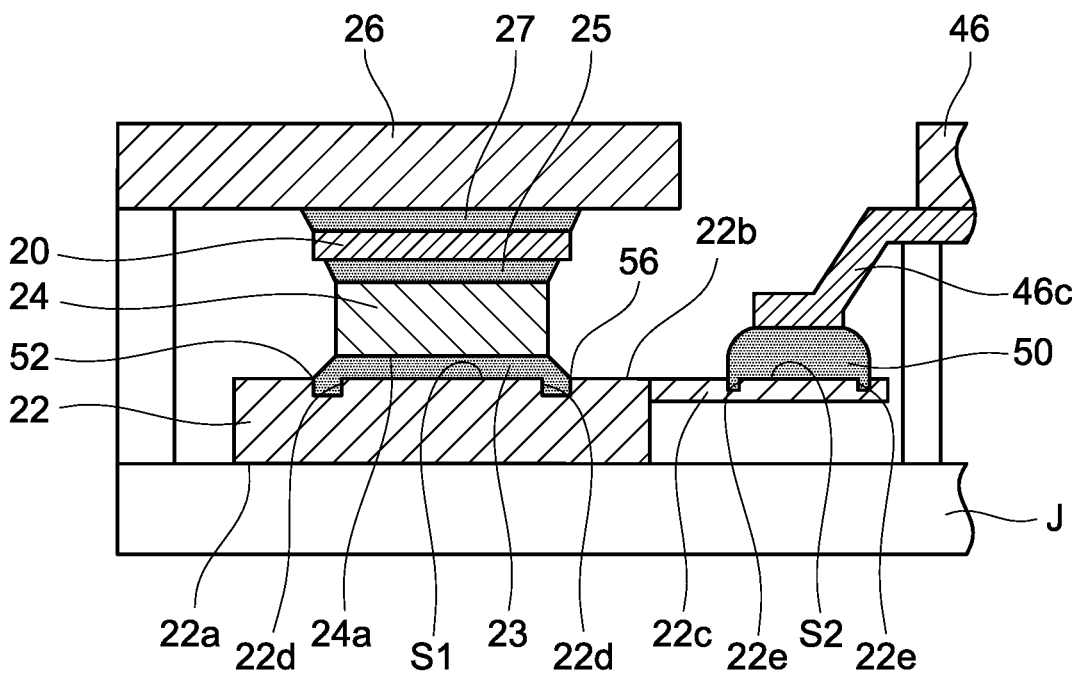
FIG. 10 is a diagram that shows soldering between the first upper heat dissipating plate 22 and a first conductor spacer 24, in which the solder absorbing groove 22d in the variant shown in FIG. 9 is adopted in the first upper heat dissipating plate 22.

As shown in FIG. 10, according to the above configuration, a position where excessive solder is taken in in the solder absorbing groove 22d when the first upper heat dissipating plate 22 and the first conductor spacer 24 are soldered is restricted to the two opposite sides 52, 56 of the first solder joint area S1. By restricting the position where excessive solder flows into the solder absorbing groove 22d to a part of the periphery of the first solder joint area S1, the excessive solder is uniformly taken in in the solder absorbing groove 22d at the two sides 52, 56 and contact angles of the solder 23 become approximately equal there, even if the amount of excessive solder fluctuates by a certain degree. Meanwhile, since the other two opposite sides 54, 58 of the first solder joint area S1 are positioned outside the solder absorbing groove 22d, contact angles of the solder 23 become approximately equal there.

The contact angles of the solder 23 become approximately equal at each pair of the two opposite sides (52 and 56, 54 and 58) of the first solder joint area S1, so changes in relative positions and orientations between the first upper heat dissipating plate 22 and the first conductor spacer 24 are suppressed, and dimensional accuracy of the semiconductor device 10 is improved. The solder 23 at a manufacturing stage is to constitute the aforementioned solder layer 23 in the semiconductor device 10, and hence they are herein assigned the same sign. Moreover, as shown in FIG. 10, when the first upper heat dissipating plate 22 and the first conductor spacer 24 are soldered, a jig J may be utilized as needed. The aforementioned configuration relevant to the solder absorbing groove 22d can also be adopted for the solder absorbing groove 42d in the second upper heat dissipating plate 42.

Figure 11:
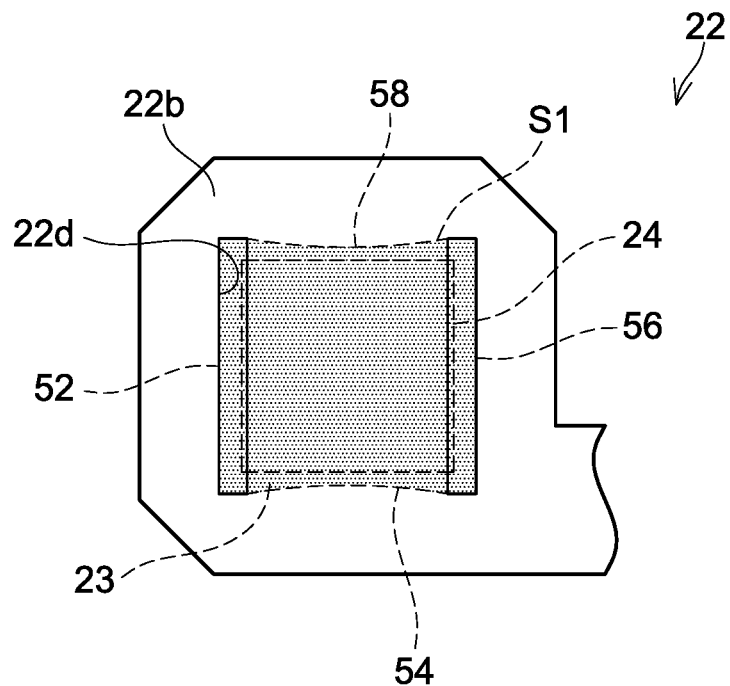
FIG. 11 shows another variant related to the solder absorbing groove 22d.

The configurations of the solder absorbing grooves 22d, 42d can be modified variously. For example, as shown in FIG. 11, the lower surface 22b of the first upper heat dissipating plate 22 may be provided with two solder absorbing grooves 22d opposite to each other in the first direction, along the periphery of the first solder joint area S1. In other words, the solder absorbing groove 22d may not be provided in an annular shape. In this case as well, the two sides 52, 56 opposite to each other in the first direction are positioned inside the solder absorbing grooves 22d, whereas the other two sides 54, 58 opposite to each other in the second direction are positioned outside the solder absorbing grooves 22d, in the periphery of the first solder joint area S1.

Figure 12:
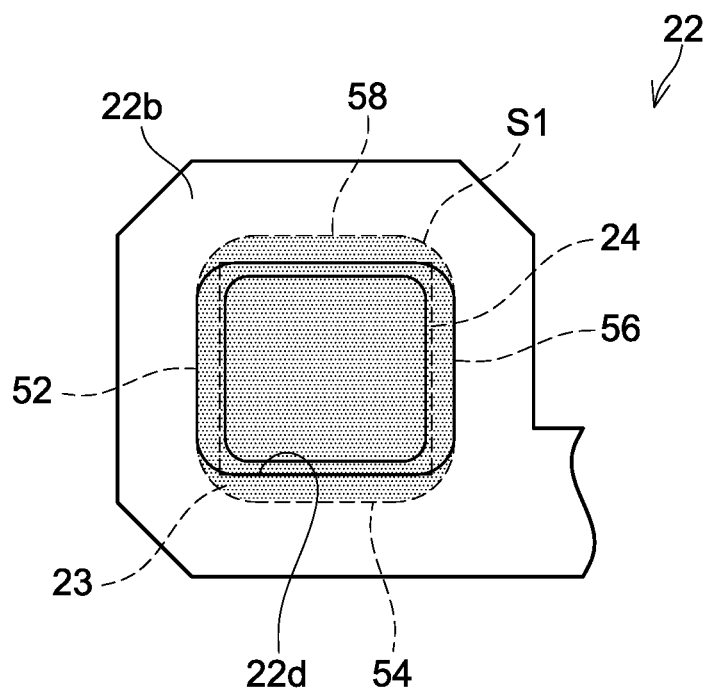
FIG. 12 shows still another variant related to the solder absorbing groove 22d.

Alternatively, as shown in FIG. 12, the solder absorbing groove 22d may have different widths or different cross-sectional areas between at a pair of two opposing sections and at another pair of two opposing sections. Specifically, the width at two sections opposite to each other in the second direction may be made sufficiently smaller than the width at two sections opposite to each other in the first direction. Due to this, the cross-sectional area at the two sections opposite to each other in the second direction is reduced to a degree by which these two sections cannot take in excessive solder sufficiently. According to such a configuration, when the first upper heat dissipating plate 22 and the first conductor spacer 24 are soldered, the two sides 54, 58 of the first solder joint area S1, which are opposite to each other in the second direction, cross over the solder absorbing groove 22d and are positioned outside the solder absorbing groove 22d. On the other hand, the two sides 52, 56 of the first solder joint area S1, which are opposite to each other in the first direction, are positioned inside the solder absorbing groove 22d. In other words, with the configuration shown in FIG. 12 as well, the two sides 52, 56 opposite to each other in the first direction are positioned inside the solder absorbing groove 22d, and the other two sides 54, 58 opposite to each other in the second direction are positioned outside the solder absorbing groove 22d, in the periphery of the first solder joint area S1. The solder absorbing groove 22d may not be provided in an annular shape, and may be divided into, for example, the four sections mentioned above.

(Variant Related to Solder Absorbing Groove 22e)

As mentioned before, the first joint 22c of the first upper heat dissipating plate 22 and the second joint 46c of the second lower heat dissipating plate 46 are joined to each other via the solder layer 50. The first joint 22c of the first upper heat dissipating plate 22 is provided with the solder absorbing groove 22e such that the solder absorbing groove 22e surrounds the solder layer 50. When the first joint 22c of the first upper heat dissipating plate 22 and the second joint 46c of the second lower heat dissipating plate 46 are soldered to each other, adsorption force acts between the two joints 22c, 46c, due to surface tension of the molten solder. Here, the first joint 22c of the first upper heat dissipating plate 22 is positioned apart from a center of gravity of the first upper heat dissipating plate 22, so the adsorption force that acts on the first joint 22c is likely to change the position and orientation of the first upper heat dissipating plate 22. The same applies to the second lower heat dissipating plate 46. As such, in a case of soldering two members to each other, if adsorption force caused by surface tension of the molten solder acts on a position apart from a center of gravity of at least one of the members, the relative positions and orientations of the two members are likely to change, and dimensional accuracy of the product may be decreased.

Figure 13:
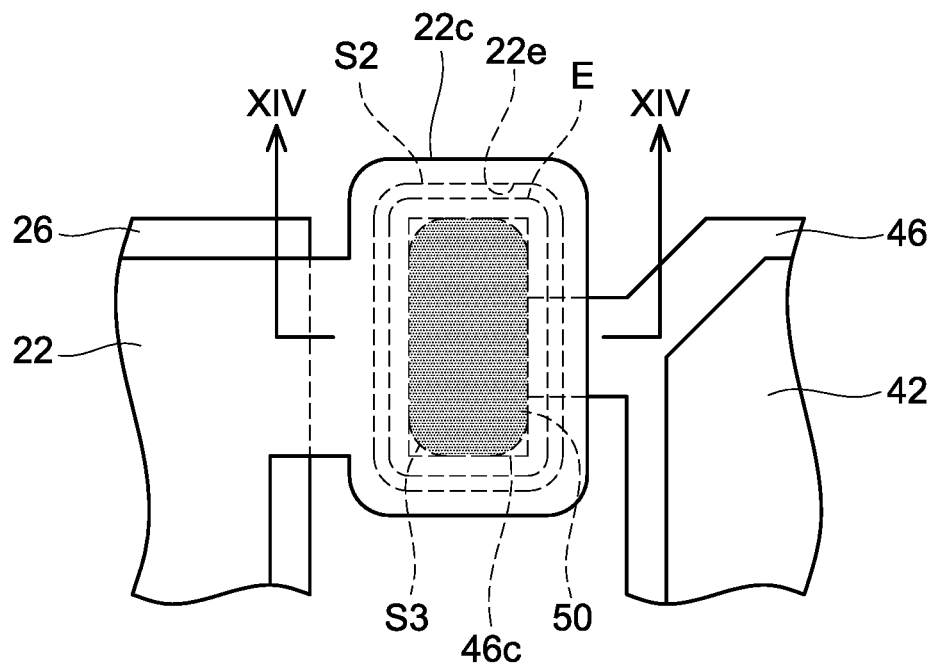
FIG. 13 shows a variant of a solder absorbing groove 22e in a first joint 22c.
Figure 14:
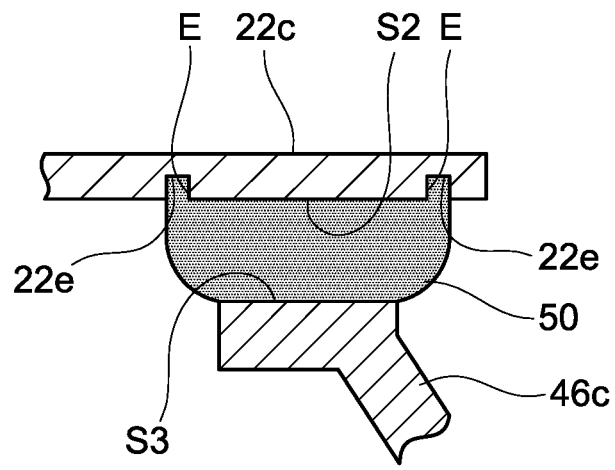
FIG. 14 shows a cross-sectional view taken along a line XIV-XIV in FIG. 13.

With respect to the above problem, the solder absorbing groove 22e in the first joint 22c can adopt a configuration described below. As shown in FIGS. 13 and 14, a region of the first joint 22c of the first upper heat dissipating plate 22, which is in contact with the solder layer 50, is referred to as a second solder joint area S2, and a region of the second joint 46c of the second lower heat dissipating plate 46, which is in contact with the solder layer 50, is referred to as a third solder joint area S3. In this case, an inner periphery E of the solder absorbing groove 22e may be positioned outside the third solder joint area S3 in a plan view (see FIG. 13). In other words, the solder absorbing groove 22e in the first joint 22c may be provided such that an area of the second solder joint area S2 in the first joint 22c is larger than an area of the third solder joint area S3 in the second joint 46c. The plan view herein means observation along a direction vertical to the solder layer 50 that joins the first joint 22c and the second joint 46c to each other.

Figure 15:
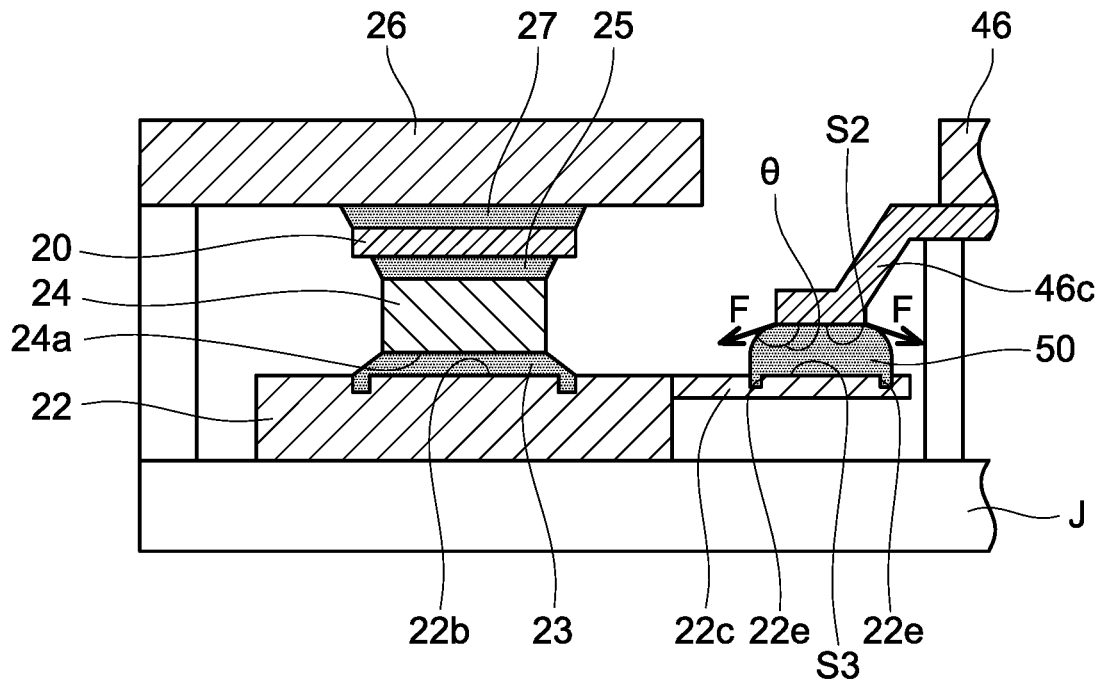
FIG. 15 is a diagram that shows soldering between the first upper heat dissipating plate 22 and the first conductor spacer 24, in which the solder absorbing groove 22e in the variant shown in FIGS. 13, 14 is adopted in the first joint 22c of the first upper heat dissipating plate 22.

As shown in FIG. 15, according to the above configuration, at the manufacturing stage of the semiconductor device 10, a contact angle θ of the molten solder 50 relative to the second solder joint area S2 becomes sufficiently larger than 90 degrees when the first joint 22c and the second joint 46c are soldered. As described before, when the solder 50 melts between the first joint 22c and the second joint 46c, adsorption force acts between the first joint 22c and the second joint 46c, due to surface tension F of the molten solder 50. A magnitude of this adsorption force varies in accordance with the contact angle θ. In a range where the contact angle θ exceeds 90 degrees, the adsorption force becomes smaller with larger contact angle θ. With the small adsorption force that acts on the first joint 22c and the second joint 46c, changes in relative positions and orientations between the first upper heat dissipating plate 22 and the second joint 46c of the second lower heat dissipating plate 46 can be suppressed, and dimensional accuracy of the semiconductor device 10 can be improved. Here, the solder 50 at the manufacturing stage is to constitute the solder layer 50 in the semiconductor device 10, and hence they are herein assigned the same sign.

(Variant Related to Second Upper Heat Dissipating Plate 42)

Figure 16:
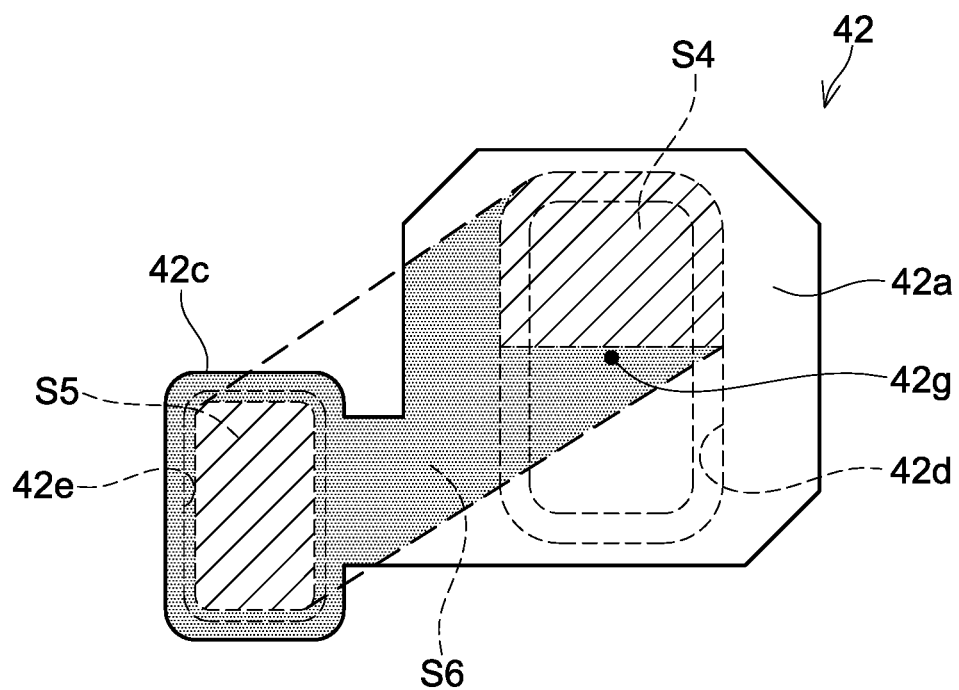
FIG. 16 shows a variant related to solder joint areas S4, S5 of a second upper heat dissipating plate 42.

In the semiconductor device 10 in the present embodiment, the second conductor spacer 44 and the N terminal 15 are soldered to the second upper heat dissipating plate 42. FIG. 16 is a diagram of the second upper heat dissipating plate 42 in a plan view, and shows a fourth solder joint area S4 and a fifth solder joint area S5 of the second upper heat dissipating plate 42. The fourth solder joint area S4 is a range to which the second conductor spacer 44 is soldered, and is a range with which the solder layer 43 positioned between the second conductor spacer 44 and the second upper heat dissipating plate 42 is in contact. The fifth solder joint area S5 is a range to which the N terminal 15 is soldered, and is a range with which the solder layer 60 positioned between the N terminal 15 and the second upper heat dissipating plate 42 is in contact. Here, a center of gravity 42g of the second upper heat dissipating plate 42 is positioned in a range S6 that links the fourth solder joint area S4 and the fifth solder joint area S5 in the plan view. This range S6 is a range positioned between the fourth solder joint area S4 and the fifth solder joint area S5, and does not include the fourth solder joint area S4 or the fifth solder joint area S5.

Figure 17:
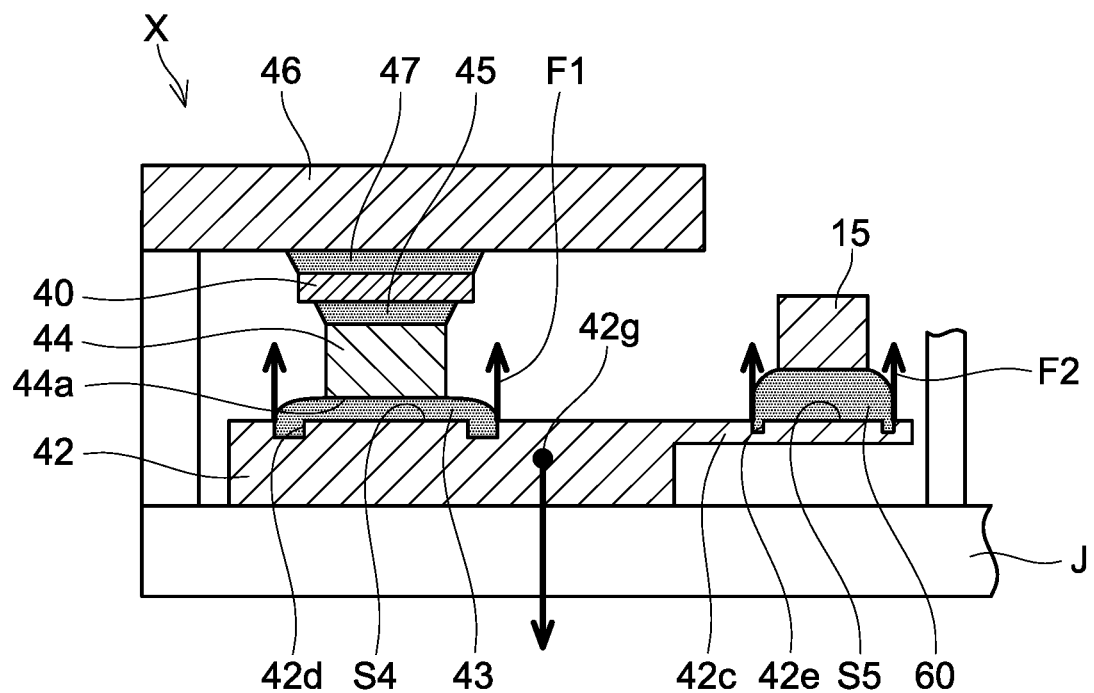
FIG. 17 is a diagram that shows soldering between the second upper heat dissipating plate 42 and a second conductor spacer 44, in which the solder joint areas S4, S5 of the second upper heat dissipating plate 42 satisfy a positional relation shown in FIG. 16.

As shown in FIG. 17, according to the above structure, the second conductor spacer 44 and the N terminal 15 can be simultaneously soldered to the second upper heat dissipating plate 42 when the semiconductor device 10 is manufactured. At this time, surface tensions F1. F2 of the molten solder 43, 60 act on the fourth solder joint area S4 and the fifth solder joint area S5, respectively, in the second upper heat dissipating plate 42. When external forces such as the surface tensions F1, F2 act on two areas in the single second upper heat dissipating plate 42, the position and orientation of the second upper heat dissipating plate 42 are likely to change, and dimensional accuracy of the semiconductor device 10 may be decreased. In particular, when the two surface tensions F1. F2 act on the second upper heat dissipating plate 42 in an unbalanced manner with respect to the center of gravity 42g, the orientation of the second upper heat dissipating plate 42 is likely to change (i.e., is likely to tilt). In this respect, as described before, the semiconductor device 10 in the present embodiment has the center of gravity 42g of the second upper heat dissipating plate 42 positioned in the range S6 that links the fourth solder joint area S4 and the fifth solder joint area S5 in the plan view. According to such a configuration, the surface tensions F1, F2 of the molten solder respectively act on both sides relative to the center of gravity 42g of the second upper heat dissipating plate 42, so changes in position and especially in orientation of the second upper heat dissipating plate 42 are suppressed. Consequently, dimensional accuracy of the semiconductor device 10 can be improved.

(Variants Related to Suspended Terminals 13, 17)

As described before, the semiconductor device 10 in the present embodiment includes the suspended terminals 13, 17 (see FIG. 5). Moreover, the encapsulant 12 is provided with the recesses 12e, 12f adjacent to the suspended terminals 13, 17, respectively. When the semiconductor device 10 operates and the semiconductor chips 20, 40 generate heat, the encapsulant 12 thermally expands. At this time, stress is likely to locally increase at positions of the recesses 12e, 12f, so cracks may occur there.

Figure 18:
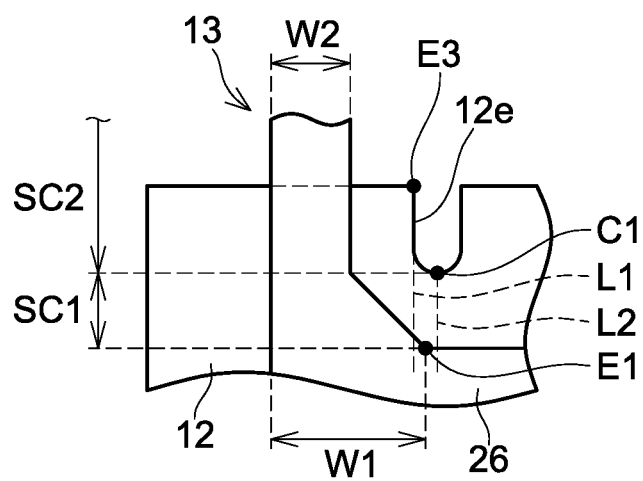
FIG. 18 shows a variant related to a suspended terminal 13.

With respect to the above problem, as shown in FIG. 18, the suspended terminal 13 may have its width dimension W2 increased at its base end inside the encapsulant 12. According to such a configuration, the suspended terminal 13 is less likely to be displaced relative to the first lower heat dissipating plate 26 (i.e., increases its rigidity), and the thermal expansion of the encapsulant 12 is suppressed by the suspended terminal 13. The stress generated in the encapsulant 12 is thereby mitigated at the recess 12e adjacent to the suspended terminal 13, and generation of cracks at the recess 12e can be suppressed. Similarly, the other of the suspended terminals, namely, the suspended terminal 17 may also have its width dimension increased at its proximal end. The stress generated at the other of the recesses, namely, the recess 12f is thereby also mitigated.

As an example, in the example shown in FIG. 18, the suspended terminal 13 includes a first section SC1 that extends from the first lower heat dissipating plate 26 and a second section SC2 that extends from the first section SC1. The first section SC1 is a section provided inside the encapsulant 12, and the second section SC2 is a section that extends over the inside and the outside of the encapsulant 12. The first section SC1 has a width dimension W1 larger than the width dimension W2 of the second section SC2. In the first section SC1, the width dimension of the suspended terminal 13 gradually increases from W2 to W1 toward the first lower heat dissipating plate 26. A similar configuration hereto can also be adopted for the other of the terminals, namely, the suspended terminal 17, and the stress generated at the other of the recesses, namely, the recess 12f is also mitigated thereby.

The base end E1 of the suspended terminal 13 may be positioned within a range formed by extending the recess 12e in its depth direction, but no particular limitation is imposed thereto. In other words, when a phantom line L1 extends from an end E3 of the recess 12e that is positioned on a suspended terminal 13 side along the depth direction of the recess 12e, the phantom line L1 may intersect with the first section SC1 of the suspended terminal 13. According to such a configuration, the base end E1 of the suspended terminal 13 is positioned in proximity to the recess 12e, so generation of cracks at the recess 12e in the encapsulant 12 can be effectively suppressed. On the other hand, when a phantom line L2 extends from a center C1 of the recess 12e along the depth direction of the recess 12e, the phantom line L2 may not intersect with the first section SC1 of the suspended terminal 13. In another embodiment, however, the first section SC1 of the suspended terminal 13 may be further enlarged to a position at which the first section SC1 intersects with the phantom line L2 extending from the center C1 of the recess 12e. The shape of the first section SC1 is not limited to the shapes described herein, and can be modified as appropriate.

When the semiconductor chips 20, 40 generate heat during use of the semiconductor device 10, the encapsulant 12 thermally expands mainly in a longitudinal direction of the encapsulant 12 (in a right-left direction in FIG. 1). In this respect, the suspended terminals 13, 17 extend vertically relative to the longitudinal direction of the encapsulant 12, and thus the thermal expansion of the encapsulant 12 can effectively be suppressed by the suspended terminals 13, 17.

The structures of the suspended terminals 13, 17 can be modified variously. FIG. 19 shows some variants of the suspended terminal 13. Structures shown in FIGS. 19(A) to 19(E) can also be adopted for the other of the suspended terminals, namely, the suspended terminal 17. In the suspended terminal 13 shown in FIG. 19(A), the width dimension W1 of the suspended terminal 13 at the base end E1 is further increased such that when the phantom line L2 extends from the center C of the recess 12e along the depth direction of the recess 12e, the phantom line L2 intersects with the first section SC1 of the suspended terminal 13. According to such a configuration, the suspended terminal 13 is in contact with the encapsulant 12 by a larger area, and thus the thermal expansion of the encapsulant 12 can further be suppressed by the suspended terminal 13. Due to this, the thermal expansion of the encapsulant 12 caused by heat generated in the semiconductor chips 20, 40 is further suppressed, and the stress generated at the recess 12e can further be mitigated.

Figure 19A:
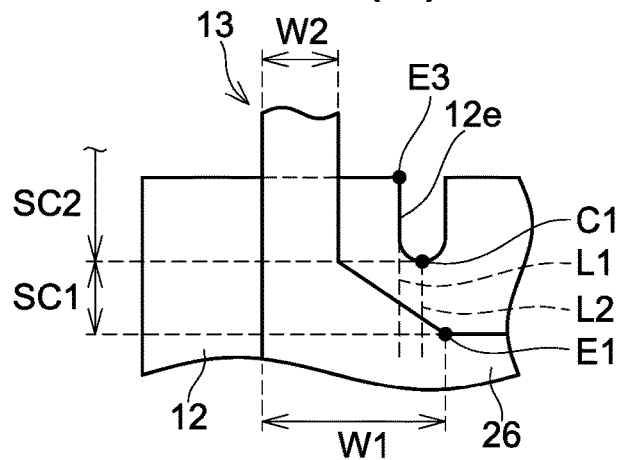
FIGS. 19(A) to 19(E) show other variants related to the suspended terminal 13.
Figure 19B:
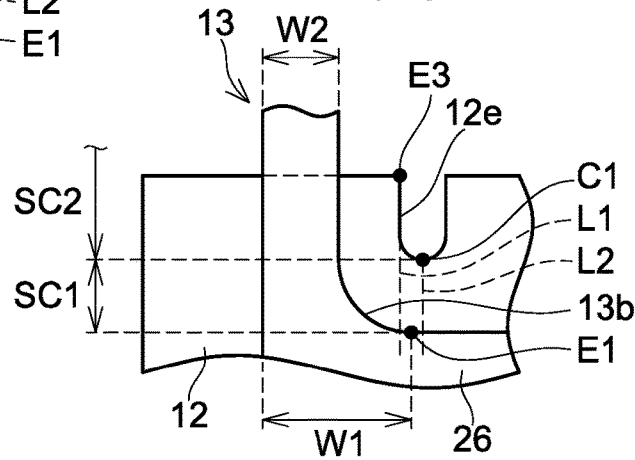
Figure 19C:
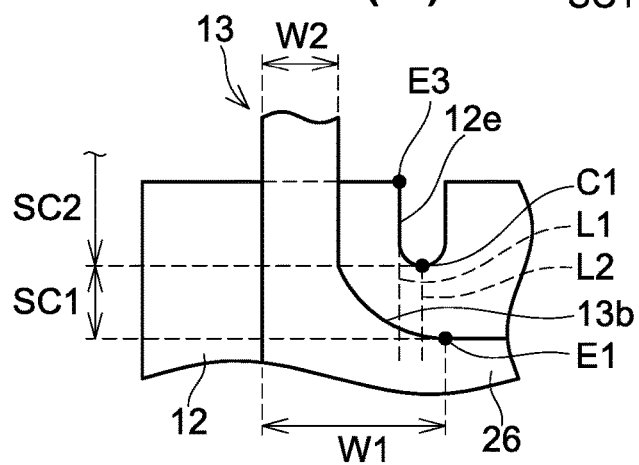

In the suspended terminal 13 shown in FIG. 19(B), one lateral edge 13b of lateral edges of the suspended terminal 13 is curved in the first section SC1. According to such a configuration, stress concentration in the encapsulant 12 that is in contact with the lateral edge 13b of the suspended terminal 13 is mitigated, and the stress generated at the recess 12e positioned in proximity thereto can further be mitigated. In the suspended terminal 13 shown in FIG. 19(C), the phantom line L2, which extends from the center C1 of the recess 12e along the depth direction of the recess 12e, intersects with the first section SC1 of the suspended terminal 13. Furthermore, the one lateral edge 13b of the suspended terminal 13 is curved in the first section SC1. In other words, the suspended terminal 13 shown in FIG. 19(C) includes both of the features of the suspended terminals 13 shown in FIGS. 19(A) and 19(B), and can effectively mitigate the stress generated at the recess 12e.

Figure 19D:
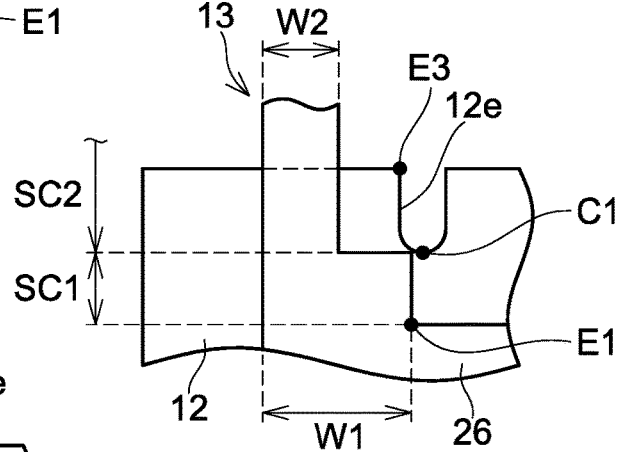
Figure 19E:
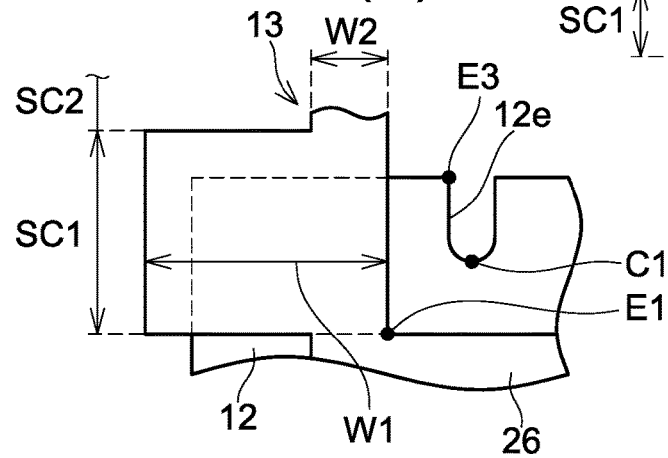

In the suspended terminal 13 shown in FIG. 19(D), the width dimensions W1, W2 of the suspended terminal 13 change discontinuously between the first section SC1 and the second section SC2, and the width dimension W1 in the first section SC1 is constant. According to such a configuration, the suspended terminal 13 is in contact with the encapsulant 12 by a larger area, and thus the thermal expansion of the encapsulant 12 is further suppressed by the suspended terminal 13. Due to this, the thermal expansion of the encapsulant 12 caused by heat generated in the semiconductor chips 20, 40 is further suppressed, and the stress generated at the recess 12e can further be mitigated. In the suspended terminal 13 shown in FIG. 19(E), the width dimension W1 of the suspended terminal 13 in the first section SC1 is increased toward an opposite side from the recess 12e (i.e., toward the left side in the figure). According to such a configuration, the width dimension W1 of the suspended terminal 13 in the first section SC1 can further be increased, without interfering with the recess 12e or the first signal terminals 18. The suspended terminal 13 is thereby less likely to be displaced (i.e., enhances its rigidity), and thus the stress generated at the recess 12e can further be mitigated. Here, a part of the first section SC1 of the suspended terminal 13 may be positioned outside the encapsulant 12.

(Variant Related to N Terminal 15)

As described before, in the semiconductor device 10 in the present embodiment, the N terminal 15 is joined to the third joint 42c of the second upper heat dissipating plate 42 via the solder layer 60. In other words, at the manufacturing stage of the semiconductor device 10, soldering is performed for the N terminal 15 and the third joint 42c of the second upper heat dissipating plate 42. In this soldering, the molten solder layer 60 needs to be prevented from unintentionally spreading over a wide range in the N terminal 15 and the third joint 42c. With respect to this problem, the N terminal 15 can adopt a configuration described below.

Figure 20:
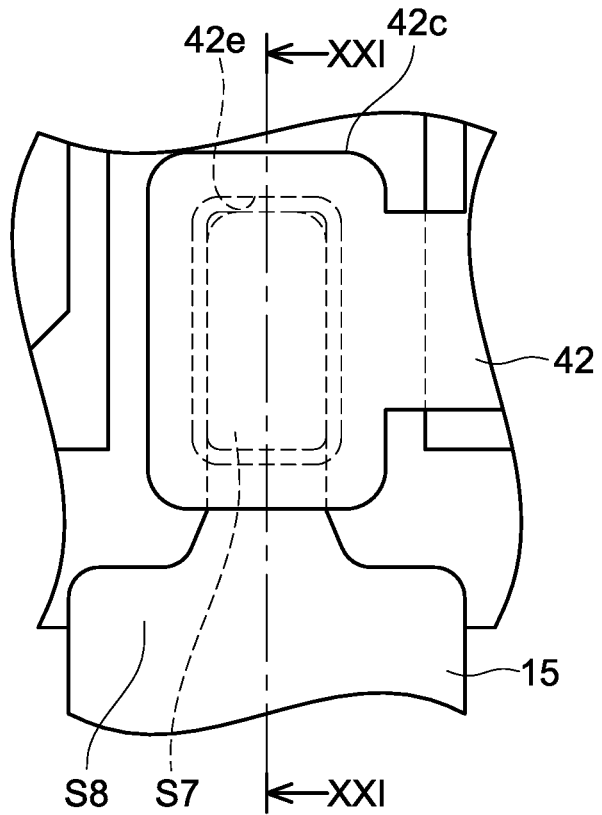
FIG. 20 shows a variant related to an N terminal 15.
Figure 21:
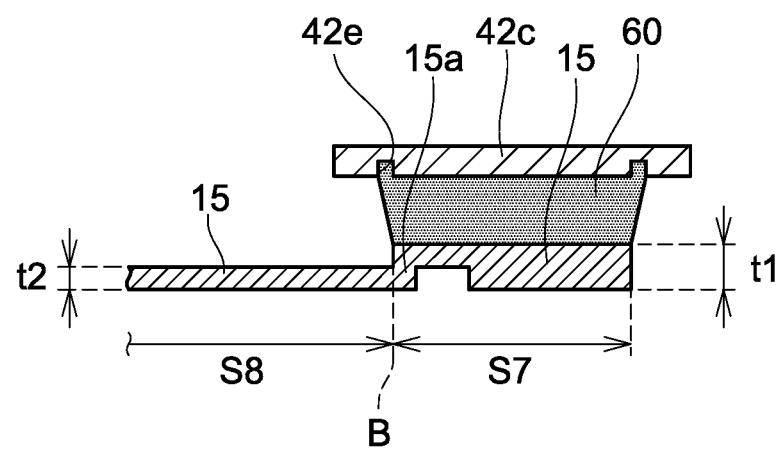
FIG. 21 shows a cross-sectional view taken along a line XXI-XXI in FIG. 20.

As shown in FIGS. 20 and 21, the N terminal 15 may include a bend 15a that bends in its thickness direction at a boundary B between a joint area S7 that is in contact with the solder layer 60 and a non-joint area S8 adjacent to the joint area S7. According to such a configuration, wetting and spreading of the solder layer 60, which has fluidity, beyond the bend 15a is suppressed at the manufacturing stage of the semiconductor device 10. Due to this, excessive wetting and spreading of the solder layer 60 beyond the intended boundary B between the joint area S7 and the non-joint area S8 can be suppressed.

The bend 15a can be formed easily by bending and the like at the manufacturing stage of the semiconductor device 10. Therefore, the boundary B of the joint area S7 in the N terminal 15 can be changed easily by changing the position where the bend 15a is formed. Therefore, by making the joint area S7 correspond to the shape of the third joint 42c of the second upper heat dissipating plate 42 (or the position of the solder absorbing groove 42e), a joint area between the second upper heat dissipating plate 42 and the N terminal 15 can be maximized. Due to this, the bend 15a of the N terminal 15 and the third joint 42c of the second upper heat dissipating plate 42 further suppress wetting and spreading of the solder layer 60 at the manufacturing stage. The technology described here is not limited to the N terminal 15, and can also be adopted for a power terminal of another type (or with another application purpose).

The N terminal 15 may include a thick-plate section and a thin-plate section, although no particular limitation is imposed thereto. As shown in FIG. 21, the thick-plate section has a thickness dimension t1 larger than a thickness dimension t2 of the thin-plate section. In this case, the bend 15a may be positioned in the thin-plate section. The bend 15a positioned in the thin-plate section enables easy formation of the bend 15a by bending and the like. Therefore, even if the position of the solder absorbing groove 42e is changed, for example, the position of the bend 15a in the N terminal 15 can be easily made to correspond to the changed position of the solder absorbing groove 42e. Due to this, the joint area between the second upper heat dissipating plate 42 and the N terminal 15 can be maximized easily.

A larger joint area between the second upper heat dissipating plate 42 and the N terminal 15 causes larger thermal stress generated in the N terminal 15 when the first semiconductor chip 20 generates heat. In this respect, with the bend 15a provided at the N terminal 15, the thermal stress can be mitigated by the bend 15a. Therefore, even if the joint area between the second upper heat dissipating plate 42 and the N terminal 15 is maximized, a decrease in reliability of the semiconductor device 10 can be prevented.

As described above, the joint area with the solder layer 60 (i.e., the area of the joint area S7) can be adjusted by changing the position of the bend 15a in the N terminal 15. Here, a larger joint area with the solder layer 60 makes the position of the bend 15a closer to an outer surface of the encapsulant 12 (i.e., the outside of the encapsulant 12) along a longitudinal direction of the N terminal 15. In this case, a distance from the outer surface of the encapsulant 12 to the joint portion with the solder layer 60 is shorter, so vibrations externally applied to the N terminal 15 are likely to be transferred to the joint portion with the solder layer 60. When the external vibrations are likely to be transferred to the joint portion with the solder layer 60, there may be a risk of a decrease in reliability, for example, generation of cracks in the solder layer 60. However, with the bend 15a provided at the N terminal 15, the vibrations can be mitigated by the bend 15a. Therefore, by providing the bend 15a at the N terminal 15, the decrease in reliability of the semiconductor device 10 can be prevented, while increasing the joint area with the solder layer 60.

What is claimed is:

1. A semiconductor device comprising:
   a first semiconductor chip;
   a second semiconductor chip;
   an encapsulant encapsulating the first semiconductor chip and the second semiconductor chip;
   at least two first signal terminals extending over inside and outside of the encapsulant and connected to the first semiconductor chip inside the encapsulant; and
   at least two second signal terminals extending over the inside and the outside of the encapsulant and connected to the second semiconductor chip inside the encapsulant, wherein:
   the at least two first signal terminals and the at least two second signal terminals protrude from the encapsulant in a same direction,
   each of the at least two first signal terminals comprises, inside the encapsulant, a section where the first signal terminal extends farther away from the at least two second signal terminals along a direction toward the first semiconductor chip,
   each of the at least two second signal terminals comprises, inside the encapsulant, a section where the second signal terminal extends farther away from the at least two first signal terminals along a direction toward the second semiconductor chip and
   a distance outside the encapsulant between (i) any one of the at least two first signal terminals and (ii) any one of the at least two second signal terminals is smaller than a distance between the first semiconductor chip and the second semiconductor chip.

2. The semiconductor device according to claim 1, wherein at least one of the at least two first signal terminals and the at least two second signal terminals extends linearly outside the encapsulant.

3. The semiconductor device according to claim 1, wherein at least one of the at least two first signal terminals and the at least two second signal terminals comprises, inside the encapsulant, a crank shape that includes at least two bends.

4. The semiconductor device according to claim 1, wherein the at least two first signal terminals and the at least two second signal terminals comprise plane-symmetrical shapes to each other.

5. The semiconductor device according to claim 1, wherein at least one of the at least two first signal terminals and the at least two second signal terminals comprises a plate shape and is bent in a thickness direction of the at least one of the at least two first and second signal terminals inside the encapsulant.

6. The semiconductor device according to claim 2, wherein at least one of the at least two first signal terminals and the at least two second signal terminals comprises, inside the encapsulant, a crank shape that includes at least two bends.

7. The semiconductor device according to claim 2, wherein the at least two first signal terminals and the at least two second signal terminals comprise plane-symmetrical shapes to each other.

8. The semiconductor device according to claim 3, wherein the at least two first signal terminals and the at least two second signal terminals comprise plane-symmetrical shapes to each other.

9. The semiconductor device according to claim 6, wherein the at least two first signal terminals and the at least two second signal terminals comprise plane-symmetrical shapes to each other.

10. The semiconductor device according to claim 2, wherein at least one of the at least two first signal terminals and the at least two second signal terminals comprises a plate shape and is bent in a thickness direction of the at least one of the at least two first and second signal terminals inside the encapsulant.

11. The semiconductor device according to claim 3, wherein at least one of the at least two first signal terminals and the at least two second signal terminals comprises a plate shape and is bent in a thickness direction of the at least one of the at least two first and second signal terminals inside the encapsulant.

12. The semiconductor device according to claim 4, wherein at least one of the at least two first signal terminals and the at least two second signal terminals comprises a plate shape and is bent in a thickness direction of the at least one of the at least two first and second signal terminals inside the encapsulant.

13. The semiconductor device according to claim 6, wherein at least one of the at least two first signal terminals and the at least two second signal terminals comprises a plate shape and is bent in a thickness direction of the at least one of the at least two first and second signal terminals inside the encapsulant.

14. The semiconductor device according to claim 7, wherein at least one of the at least two first signal terminals and the at least two second signal terminals comprises a plate shape and is bent in a thickness direction of the at least one of the at least two first and second signal terminals inside the encapsulant.

15. The semiconductor device according to claim 8, wherein at least one of the at least two first signal terminals and the at least two second signal terminals comprises a plate shape and is bent in a thickness direction of the at least one of the at least two first and second signal terminals inside the encapsulant.

16. The semiconductor device according to claim 9, wherein at least one of the at least two first signal terminals and the at least two second signal terminals comprises a plate shape and is bent in a thickness direction of the at least one of the at least two first and second signal terminals inside the encapsulant.

* * * * *